(12) United States Patent
Ishida

(10) Patent No.: US 7,616,702 B2
(45) Date of Patent: Nov. 10, 2009

(54) TRANSMISSION CIRCUIT AND COMMUNICATION APPARATUS COMPRISING THE SAME

(75) Inventor: Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 536 days.

(21) Appl. No.: 11/653,284

(22) Filed: Jan. 16, 2007

(65) Prior Publication Data

US 2007/0165744 A1 Jul. 19, 2007

(30) Foreign Application Priority Data

Jan. 16, 2006 (JP) .............................. 2006-007882

(51) Int. Cl.
*H04L 27/36* (2006.01)
(52) U.S. Cl. ....................................... 375/298
(58) Field of Classification Search ................. 375/259, 375/268, 269, 270, 271, 272, 273, 274, 275, 375/277, 279, 280, 281, 282, 283, 295, 296, 375/298, 300, 301, 302, 303, 304, 305, 306, 375/307, 308; 398/193; 455/114.3
See application file for complete search history.

(56) References Cited

U.S. PATENT DOCUMENTS 7,248,626 B2 * 7/2007 Bremer ........................ 375/219

7,324,787 B2 * 1/2008 Kurakami et al. ............. 455/69
2004/0013183 A1 * 1/2004 Bremer ........................ 375/220
2005/0281353 A1 * 12/2005 Huang et al. ................. 375/295
2006/0285582 A1 12/2006 Sumasu et al.

FOREIGN PATENT DOCUMENTS

| JP | 03-154430 | 7/1991 |
| JP | 06-284022 | 10/1994 |
| JP | 3069880 | 5/2000 |
| WO | 2005/048627 | 5/2005 |

* cited by examiner

*Primary Examiner*—Sam K Ahn
(74) *Attorney, Agent, or Firm*—Wenderoth, Lind & Ponack, L.L.P.

(57) ABSTRACT

A transmission circuit is provided which can quickly and accurately control an output power of a transmission signal even when the transmission signal is output at a high modulation rate and in a wide dynamic range. A switching control section controls a modulation method changing section to change a modulation method of a modulated signal generating section to a modulation method having a narrow dynamic range before controlling a switching section to switch amplification sections. An output adjustment control section controls output adjusting sections so that a difference in level between a transmission signal which is smoothed by a smoothing circuit and is before the amplification sections are switched, and a transmission signal which is after the amplification sections are switched, is caused to be smaller than a predetermined difference threshold value, when the modulated signal generating section operates in the modulation method having the narrow dynamic range.

11 Claims, 16 Drawing Sheets

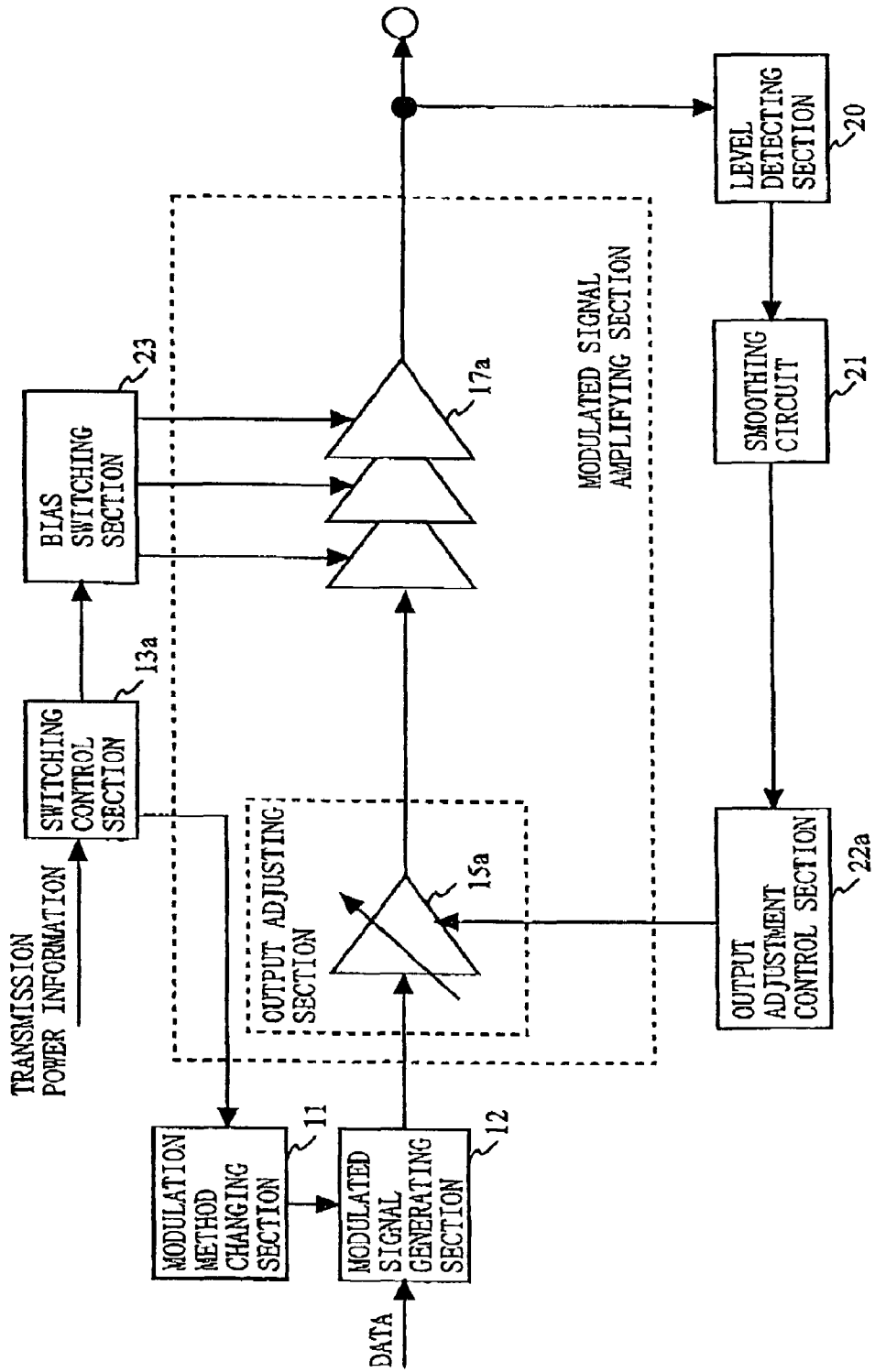
F I G. 1 2

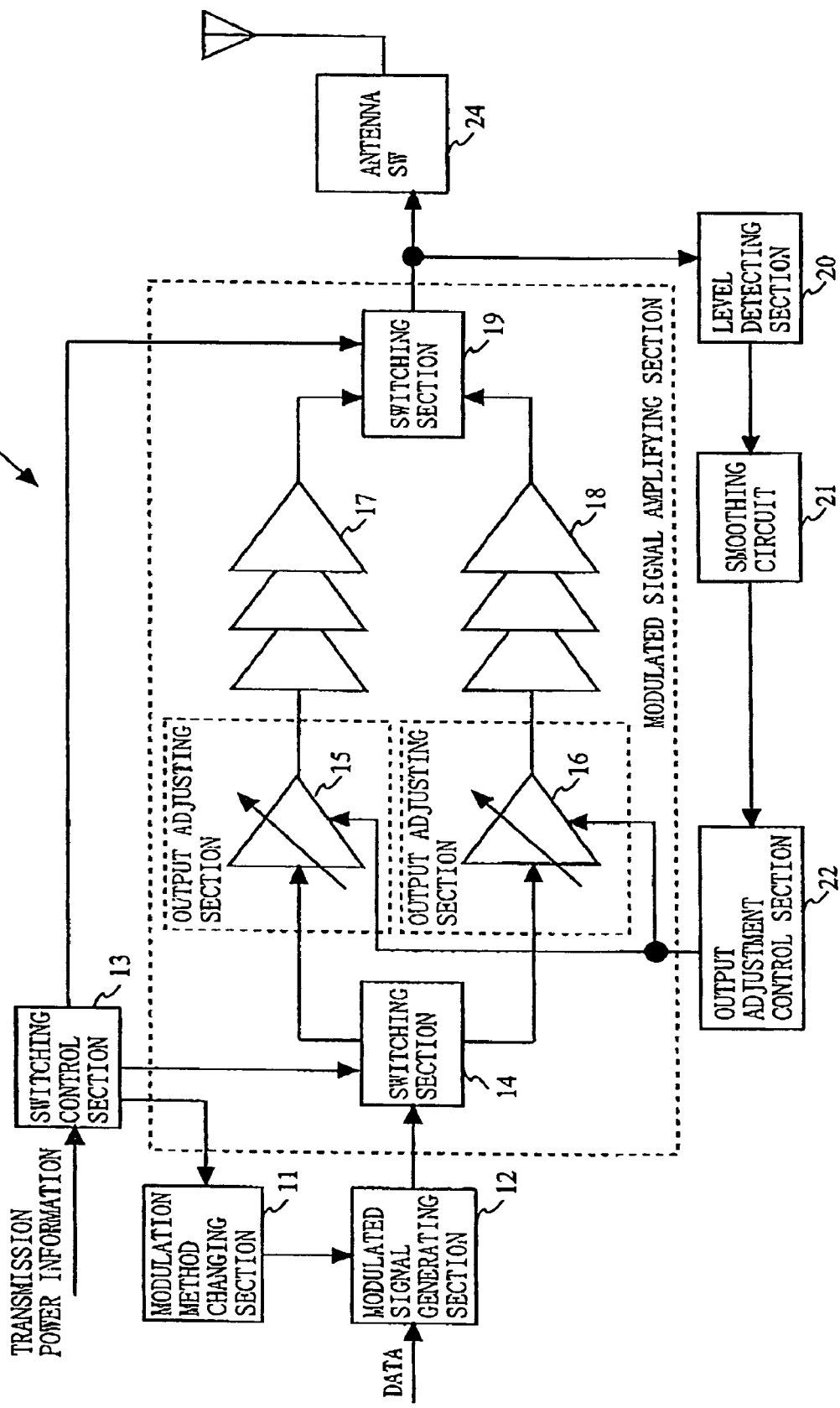

F I G. 1 5
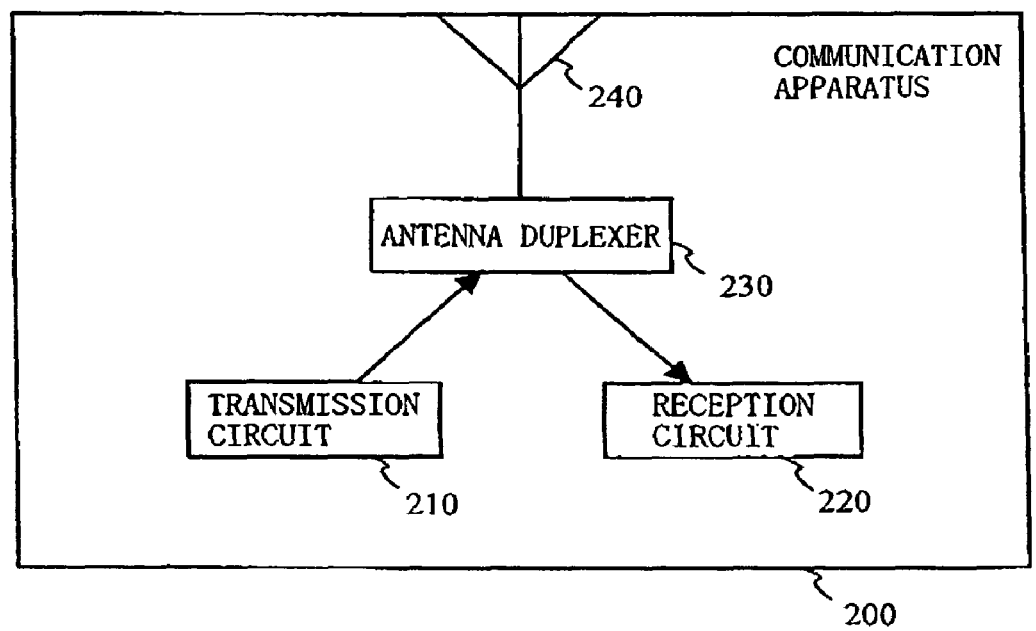

and communication apparatus comprising the same

BACKGROUND OF THE INVENTION

1. Field of the Invention

The present invention relates to a transmission circuit for use in a communication apparatus for mobile telephony, wireless LAN or the like. More particularly, the present invention relates to a transmission circuit which can control an output power of a transmission signal quickly and accurately even when the transmission signal is output at a high modulation rate and in a wide dynamic range, and a communication apparatus comprising the transmission circuit.

2. Description of the Background Art

There is a demand for a communication apparatus for mobile telephony, wireless LAN or the like which can control an output power of a transmission signal quickly and accurately even when the transmission signal is output at a high modulation rate and in a wide dynamic range. Hereinafter, a conventional transmission circuit for use in such a communication apparatus will be described.

For example, Japanese Laid-Open Patent Publication No. 3-154430 (hereinafter referred to as Patent Document 1) discloses a transmission circuit which automatically suppresses an output power of a transmission signal to a predetermined set value with high-speed response even when burst waves are transmitted as a transmission signal. FIG. 16 is a block diagram illustrating a configuration of a conventional transmission circuit 500 described in Patent Document 1. In FIG. 16, the conventional transmission circuit 500 comprises a transmission power amplifying section 504, an antenna 506, a loop filter 510, a gain adjuster 511, a linear modulator 512, a monitor wave generator 513, a combiner 514, band-pass filters 515 and 516, and a level detector 517. The transmission power amplifying section 504 includes a variable attenuator 502 and a power amplifier 503. The gain adjuster 511 includes a error amplification circuit 508 and a power supply circuit 509.

The linear modulator 512 outputs linearly modulated waves by linear modulation. The monitor wave generator 513 generates monitor waves which have a frequency which is not included in a transmission band of the linearly modulated waves and does not have a variation in amplitude (i.e., not modulated). The combiner 514 combines the linearly modulated waves and the monitor waves, and outputs the combined signal. The combined signal is amplified by the transmission power amplifying section 504, and is output to the band-pass filter 515 and the band-pass filter 516. The band-pass filter 515 extracts only linearly modulated waves from the combined signal, and outputs the extracted linearly modulated waves as a transmission signal from the antenna 506.

The band-pass filter 516 extracts only monitor waves from the combined signal, and outputs the extracted monitor waves to the level detector 517. The level detector 517 converts a level of the monitor waves into a detection voltage corresponding to the level of the monitor waves, and inputs the detection voltage to one of two input terminals of the error amplification circuit 508. A reference voltage Vn is input from the power supply circuit 509 to the other input terminal of the error amplification circuit 508. The error amplification circuit 508 amplifies an error voltage which is a difference between the detection voltage of the monitor waves and the reference voltage Vn. The amplified error voltage is fed back to the transmission power amplifying section 504 via the loop filter 510. The transmission power amplifying section 504 controls again for amplifying the combined signal, based on the fed-back error voltage. Thus, the conventional transmission circuit 500 has a closed loop for a power control to automatically suppress the output power of a transmission signal to the predetermined set value.

Japanese Laid-Open Patent Publication No. 6-284022 (hereinafter referred to as Patent Document 2) discloses a conventional transmission circuit which opens and closes a loop for a power control to change a response speed of the power control. FIG. 17 is a block diagram illustrating a conventional transmission circuit 600 described in Patent Document 2. In FIG. 17, the conventional transmission circuit 600 comprises a power amplifier 601, a coupler (directional coupler) 602, a detection circuit 603, an antenna 604, a gate circuit 605, a integration hold circuit 606, a error amplifier 607, an analog switch 608, a voltage control attenuator 609, a buffer amplifier 610, a voltage adjusting section 614, and a correction section 623.

The transmission circuit 600 outputs an input modulated signal as a transmission signal from the antenna 604 via the voltage control attenuator 609, the buffer amplifier 610, the power amplifier 601, and the coupler 602. In the transmission circuit 600, the detection circuit 603, the gate circuit 605, the integration hold circuit 606, the error amplifier 607, and the analog switch 608 are provided at an output of the coupler 602 to form a closed loop for controlling a gain of the voltage control attenuator 609. The correction section 623 stores a set reference value A which is used during a burst operation with the same transmission power, and a set reference value B which is used immediately after changing of the output power.

During a burst operation with the same transmission power, the transmission circuit 600 generates a reference voltage A based on the set reference value A, inputs the reference voltage A to the error amplifier 607, and adjusts the gain of the voltage control attenuator 609 using the closed loop. On the other hand, immediately after changing of the output power, the transmission circuit 600 switches the analog switch 608 to open the closed loop, generates a reference voltage B based on the set reference value B, inputs the reference voltage B to the voltage adjusting section 614, and adjusts the gain of the voltage control attenuator 609 using the open loop. Thus, the conventional transmission circuit 600 opens and closes the loop for a power control to change the response speed of the power control.

SUMMARY OF THE INVENTION

However, the conventional transmission circuit 500 (see FIG. 16) has a closed loop for controlling the output power of a transmission signal. Therefore, when a transmission signal is output at a high modulation rate and in a wide dynamic range, there is a limitation on the following ability of a power control. Also, since the frequency of an actual transmission signal is different from the frequency of monitor waves, the accuracy of the power control is reduced. In other words, when a transmission signal is output at a high modulation rate and in a wide dynamic range, the conventional transmission circuit 500 cannot control the output power of the transmission signal quickly or accurately.

The conventional transmission circuit 600 (see FIG. 17) opens and closes the loop for a power control, thereby making it possible to secure the following ability of the power control. However, when the loop is closed, a feed-back power control is not performed, so that an error occurs in the output power of a transmission signal. In other words, when a transmission signal is output at a high modulation rate and in a wide dynamic range, the conventional transmission circuit 600 cannot control the output power of the transmission signal quickly or accurately.

Therefore, an object of the present invention is to provide a transmission circuit which can control an output power quickly and accurately even when a transmission signal is output at a high modulation rate and in a wide dynamic range, and a communication apparatus comprising the transmission circuit.

The present invention is directed to a transmission circuit for controlling an output power of a transmission signal based on transmission power information. To achieve the above-described object, the transmission circuit of the present invention comprises a modulated signal generating section for modulating input data using a predetermined modulation method to generate a modulated signal, a modulation method changing section for changing a modulation method of the modulated signal generating section, at least one output adjusting section for adjusting an output of the modulated signal, a plurality of amplification sections for amplifying the modulated signal input via the output adjusting section, at least one switching section for switching an amplification section to be operated of the plurality of amplification sections, a switching control section for controlling the switching operation of the switching section based on the transmission power information, an output terminal for outputting the modulated signal amplified by the amplification section as the transmission signal, a level detecting section for detecting a level of the transmission signal, a smoothing circuit for smoothing the level of the transmission signal detected by the level detecting section, and an output adjustment control section for controlling the output adjusting section based on the smoothed level of the transmission signal to adjust the output of the modulated signal.

The switching control section controls the modulation method changing section to change the modulation method of the modulated signal generating section to a modulation method having a dynamic range narrower than that of the predetermined modulation method, before controlling the switching section to switch the plurality of amplification sections. The switching control section controls the modulation method changing section to change the modulation method of the modulated signal generating section back to the predetermined modulation method after the switching of the plurality of amplification sections is completed. The output adjustment control section controls the output adjusting section so that a difference in level between the transmission signal which is smoothed by the smoothing circuit and is before the amplification sections are switched, and the transmission signal which is after the amplification sections are switched, is caused to be smaller than a predetermined difference threshold value, when the modulated signal generating section operates in the modulation method having the narrow dynamic range.

Preferably, when the difference in level between the transmission signal before the amplification sections are switched and the transmission signal after the amplification sections are switched is not caused to be smaller than the predetermined difference threshold value, the output adjustment control section further controls the output adjusting section so that the difference in level between the transmission signal before the amplification sections are switched and the transmission signal after the amplification sections are switched is caused to be smaller than the predetermined difference threshold value.

Preferably, the plurality of amplification sections includes at least a first amplification section and a second amplification section. In this case, the switching control section controls the switching section so that the first amplification section is operated when an output power indicated by the transmission power information is larger than or equal to a predetermined threshold value, and the second amplification section is operated when the output power indicated by the transmission power information is smaller than the predetermined threshold value.

Preferably, the signal modulated by the modulation method having the narrow dynamic range is a sine wave.

The transmission circuit may further comprise an antenna switch for stopping outputting of the transmission signal to an antenna when the modulated signal generating section operates in the modulation method having the narrow dynamic range.

The output adjustment control section may store the level of the transmission signal when the modulated signal generating section operates in the predetermined modulation method, compare the stored level of the transmission signal with the level of the transmission signal when the modulated signal generating section operates in the modulation method having the narrow dynamic range, and based on a result of the comparison, correct the control performed with respect to the output adjusting section.

The transmission circuit may comprise a plurality of output adjusting sections. In this case, the switching section switches an output adjusting section to be operated of the plurality of output adjusting sections in accordance with a control of the switching control section.

The present invention is also directed to a communication apparatus comprising the above-described transmission circuit. The communication apparatus comprises the transmission circuit for generating a transmission signal, and an antenna for outputting the transmission signal generated by the transmission circuit. The communication apparatus may further comprise a reception circuit for processing a reception signal received from the antenna, and an antenna duplexer for outputting the transmission signal generated by the transmission circuit to the antenna, and the reception signal received from the antenna to the reception circuit.

A transmission circuit of the present invention may comprise a modulated signal generating section for modulating input data using a predetermined modulation method to generate a modulated signal, a modulation method changing section for changing a modulation method of the modulated signal generating section, an output adjusting section for adjusting an output of the modulated signal, an amplification section for amplifying the modulated signal input via the output adjusting section, a bias switching section for switching bias voltages to be supplied to the amplification section, a bias switching control section for controlling the switching operation of the bias switching section based on the transmission power information, an output terminal for outputting the modulated signal amplified by the amplification section as the transmission signal, a level detecting section for detecting a level of the transmission signal, a smoothing circuit for smoothing the level of the transmission signal detected by the level detecting section, and an output adjustment control section for controlling the output adjusting section based on the smoothed level of the transmission signal to adjust the output of the modulated signal.

The bias switching control section controls the modulation method changing section to change the modulation method of the modulated signal generating section to a modulation method having a dynamic range narrower than that of the predetermined modulation method, before controlling the bias switching section to switch the bias voltages to be supplied to the amplification section. The bias switching control section controls the modulation method changing section to change the modulation method of the modulated signal generating section back to the predetermined modulation method after the switching of the bias voltages to be supplied to the amplification section is completed. The output adjustment control section controls the output adjusting section so that a difference in level between the transmission signal which is smoothed by the smoothing circuit and is before the bias voltages to be supplied to the amplification section are switched, and the transmission signal which is after the bias voltages to be supplied to the amplification section are switched, is caused to be smaller than a predetermined difference threshold value, when the modulated signal generating section operates in the modulation method having the narrow dynamic range.

A transmission circuit of the present invention may comprise a modulated signal generating section for modulating input data using a predetermined modulation method to generate a modulated signal, a modulation method changing section for changing a modulation method of the modulated signal generating section, an amplitude/phase separating section for separating an amplitude component and a phase component from the modulated signal generated by the modulated signal generating section, at least one output adjusting section for adjusting outputs of the separated amplitude and phase components, a switch for receiving the amplitude component via the output adjusting section, an amplitude/phase combining section for combining the amplitude component input via the switch and the phase component input via the output adjusting section to output a modulated signal, a plurality of amplification sections for amplifying the modulated signal input via the amplitude/phase combining section, at least one switching section for switching an amplification section to be operated of the plurality of amplification sections, a switching control section for controlling the switching operation of the switching section based on the transmission power information, an output terminal for outputting the modulated signal amplified by the amplification section as the transmission signal, a level detecting section for detecting a level of the transmission signal, a smoothing circuit for smoothing the level of the transmission signal detected by the level detecting section, and an output adjustment control section for controlling the output adjusting section based on the smoothed level of the transmission signal to adjust the output of the modulated signal.

The switching control section controls the modulation method changing section to change the modulation method of the modulated signal generating section to a modulation method having a dynamic range narrower than that of the predetermined modulation method, before controlling the switching section to switch the plurality of amplification sections. The switching control section controls the modulation method changing section to change the modulation method of the modulated signal generating section back to the predetermined modulation method after the switching of the plurality of amplification sections is completed. The modulation method changing section switches connection of the switch to output a fixed voltage to the amplitude/phase combining section when the modulated signal generating section operates in the modulation method having the narrow dynamic range. The output adjustment control section controls the output adjusting section so that a difference in level between the transmission signal which is smoothed by the smoothing circuit and is before the amplification sections are switched, and the transmission signal which is after the amplification sections are switched, is caused to be smaller than a predetermined difference threshold value, when the modulated signal generating section operates in the modulation method having the narrow dynamic range.

As described above, according to the present invention, a plurality of amplification sections having different characteristics are switched and operated, depending on the magnitude of an output power indicated by transmission power information, thereby making it possible to transmit a transmission signal having a wide dynamic range with high efficiency. In addition, when the amplification sections are switched, a modulation method is changed to a modulation method having a narrow dynamic range, and therefore, based on the modulated signal having the narrow dynamic range, adjustment of the output power in association with switching of the amplification sections can be performed with high speed. Thereby, it is possible to quickly and accurately control the output power even when a transmission signal is output at a high modulation rate and in a wide dynamic range.

In addition, according to the communication apparatus of the present invention, by employing the above-described transmission circuit, it is possible to quickly and accurately control the output power even when a transmission signal is output at a high modulation rate and in a wide dynamic range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a block diagram illustrating an exemplary configuration of a transmission circuit 3 according to a third embodiment of the present invention;

FIG. 14 is a block diagram illustrated an exemplary configuration of a transmission circuit 5 according to a fifth embodiment of the present invention;

FIG. 15 is a block diagram illustrating an exemplary configuration of a communication apparatus according to a sixth embodiment of the present invention;

DESCRIPTION OF THE PREFERRED EMBODIMENTS

First Embodiment

Figure 1:
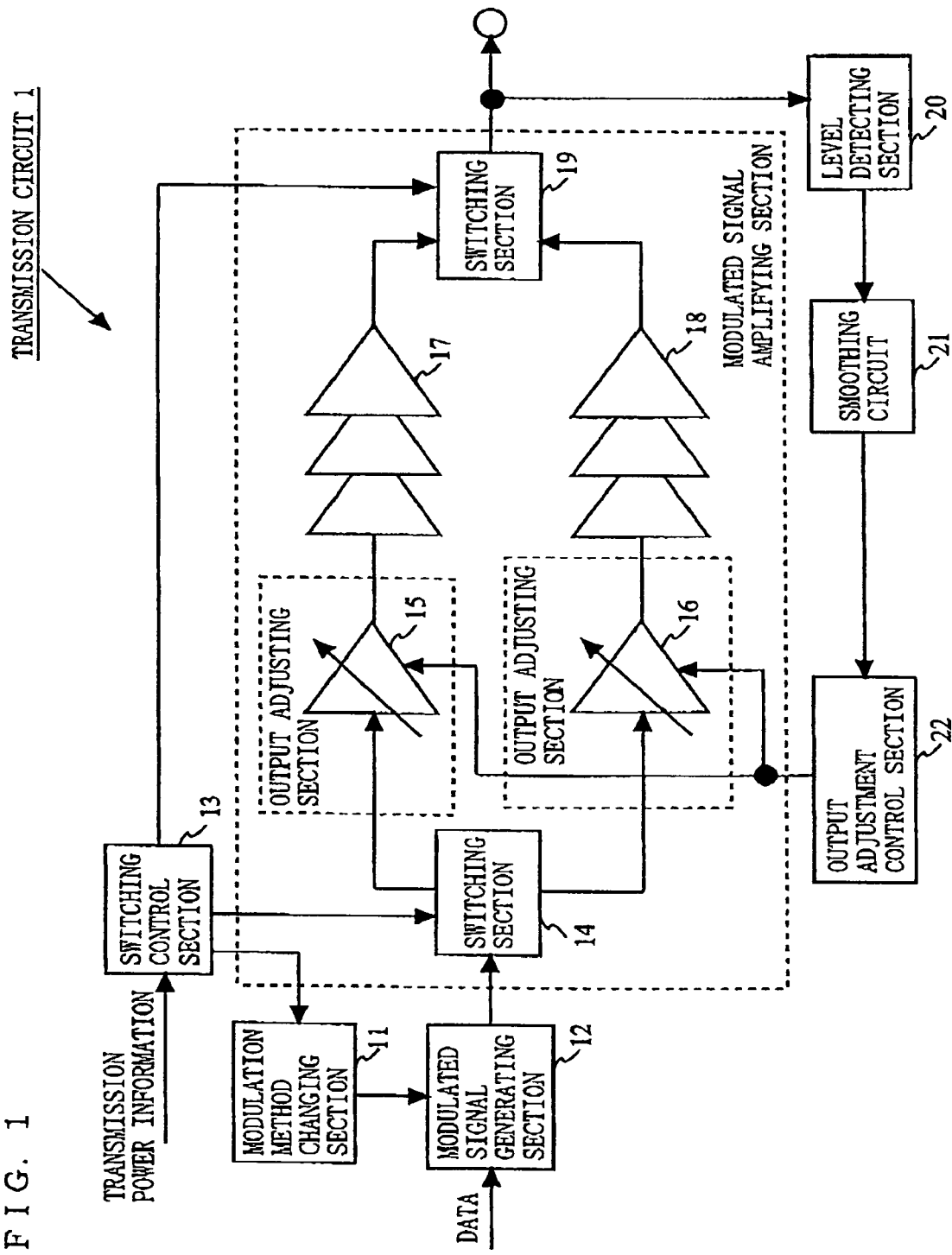
FIG. 1 is a block diagram illustrating an exemplary configuration of a transmission circuit 1 according to a first embodiment of the present invention.

FIG. 1 is a block diagram illustrating an exemplary configuration of a transmission circuit 1 according to a first embodiment of the present invention. In FIG. 1, the transmission circuit 1 comprises a modulation method changing section 11, a modulated signal generating section 12, a switching control section 13, a switching section 14, a first variable amplification section 15, a second variable amplification section 16, a first amplification section 17, a second amplification section 18, a switching section 19, a level detecting section 20, a smoothing circuit 21, and an output adjustment control section 22.

The modulation method changing section 11 changes a modulation method of the modulated signal generating section 12. The modulated signal generating section 12 modulates input data using a predetermined modulation method to generate a modulated signal. The modulated signal generated by the modulated signal generating section 12 is input to the switching section 14. The switching section 14 outputs the modulated signal to the first variable amplification section 15 or the second variable amplification section 16 in accordance with a control of the switching control section 13. The modulated signal output from the switching section 14 is amplified by the first variable amplification section 15 and the first amplification section 17, or the second variable amplification section 16 and the second amplification section 18, and is then output as a transmission signal from an output terminal via the switching section 19. Note that the first amplification section 17 and the second amplification section 18 have characteristics, such as gains, output levels and the like, which are different from each other. Note that the switching section 14, the first variable amplification section 15, the second variable amplification section 16, the first amplification section 17, the second amplification section 18, and the switching section 19 are elements for amplifying the modulated signal, and therefore, may also be collectively referred to as a modulated signal amplifying section. The first variable amplification section 15 is an element for adjusting an output of the modulated signal, and therefore, may also be referred to as a first output adjusting section. Similarly, the second variable amplification section 16 may also be referred to as a second output adjusting section.

Also, the modulated signal output from the switching section 19 is input to the level detecting section 20. The level detecting section 20 detects a level of the modulated signal. The smoothing circuit 21 smoothes the level of the modulated signal detected by the level detecting section 20. Based on the level of the modulated signal smoothed by the smoothing circuit 21, the output adjustment control section 22 controls a gain of the first variable amplification section 15 or the second variable amplification section 16.

Figure 2:
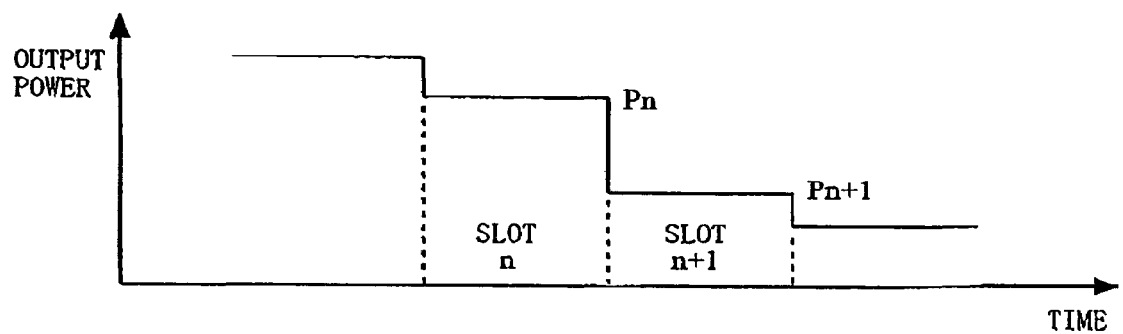
FIG. 2 is a diagram illustrating exemplary transmission power information input to the transmission circuit 1.
Figure 3:
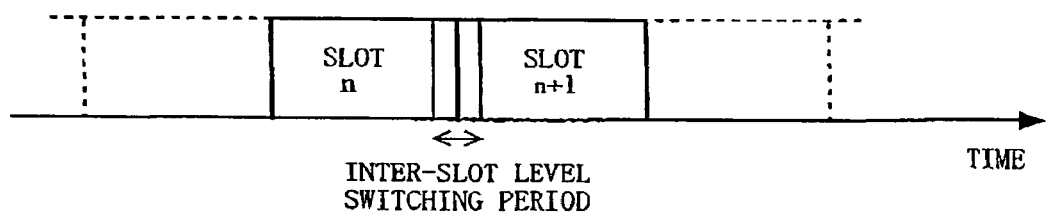
FIG. 3 is a diagram for describing an inter-slot level switching period.

Transmission power information indicating a desired magnitude of an output power of a transmission signal is input to the transmission circuit 1. FIG. 2 is a diagram illustrating an example of the transmission power information input to the transmission circuit 1. For example, as illustrated in FIG. 2, transmission power information which indicates an output power Pn in a slot n and an output power Pn+1 in a slot n+1 is input to the transmission circuit 1. An inter-slot level switching period for switching output powers is provided between each slot (see FIG. 3). The transmission circuit 1 needs to accurately control the output power of a transmission signal based on the transmission power information provided during the inter-slot level switching period. For example, in a WCDMA system, the slot period is defined to be 666 μsec, and the inter-slot level switching period is defined to be 50 μsec.

Figure 4:
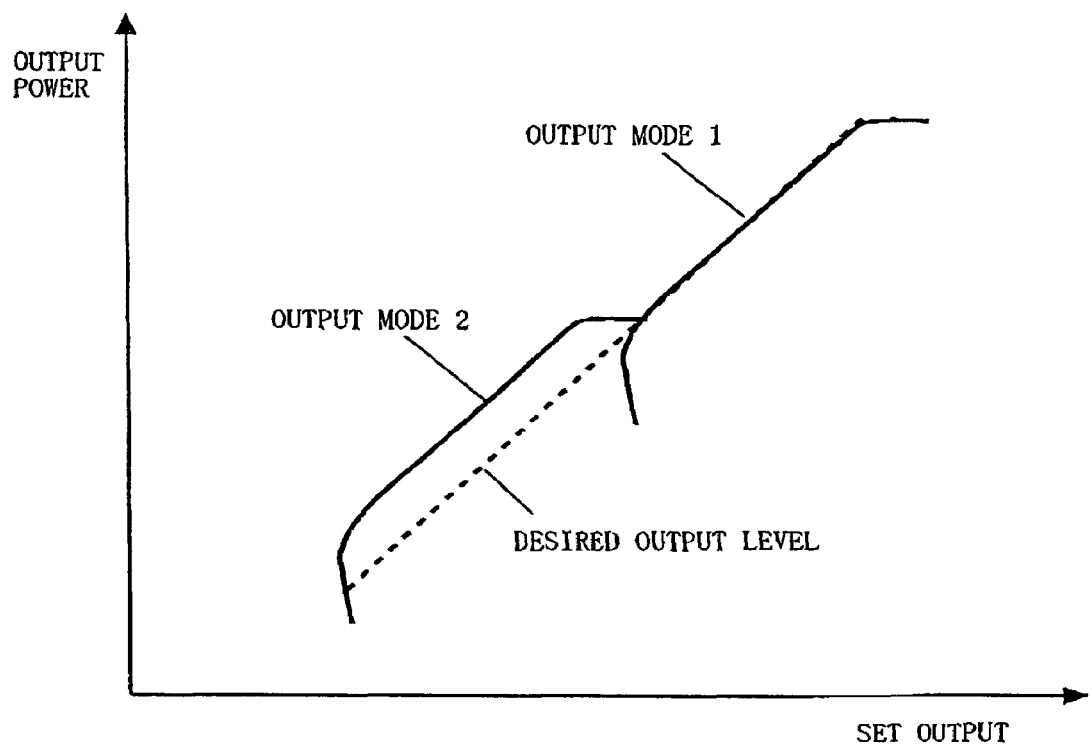
FIG. 4 is a diagram illustrating an output power range which is covered by the transmission circuit 1.

FIG. 4 is a diagram illustrating an output power range which is covered by the transmission circuit 1. As illustrated in FIG. 4, the transmission circuit 1 switches between a mode in which the transmission circuit 1 operates with a large output power (hereinafter referred to as an output mode 1) and a mode in which the transmission circuit 1 operates with a small output power (hereinafter referred to as an output mode 2), thereby covering a wide output power range. Note that, when the output power Pn in the slot n is within a range of the output mode 1 and the output power Pn+1 in the slot n+1 is within a range of the output mode 2, the transmission circuit 1 needs to control the output power ranging from the output power Pn to the output power Pn+1 over the two output modes during the inter-slot level switching period.

Figure 5:
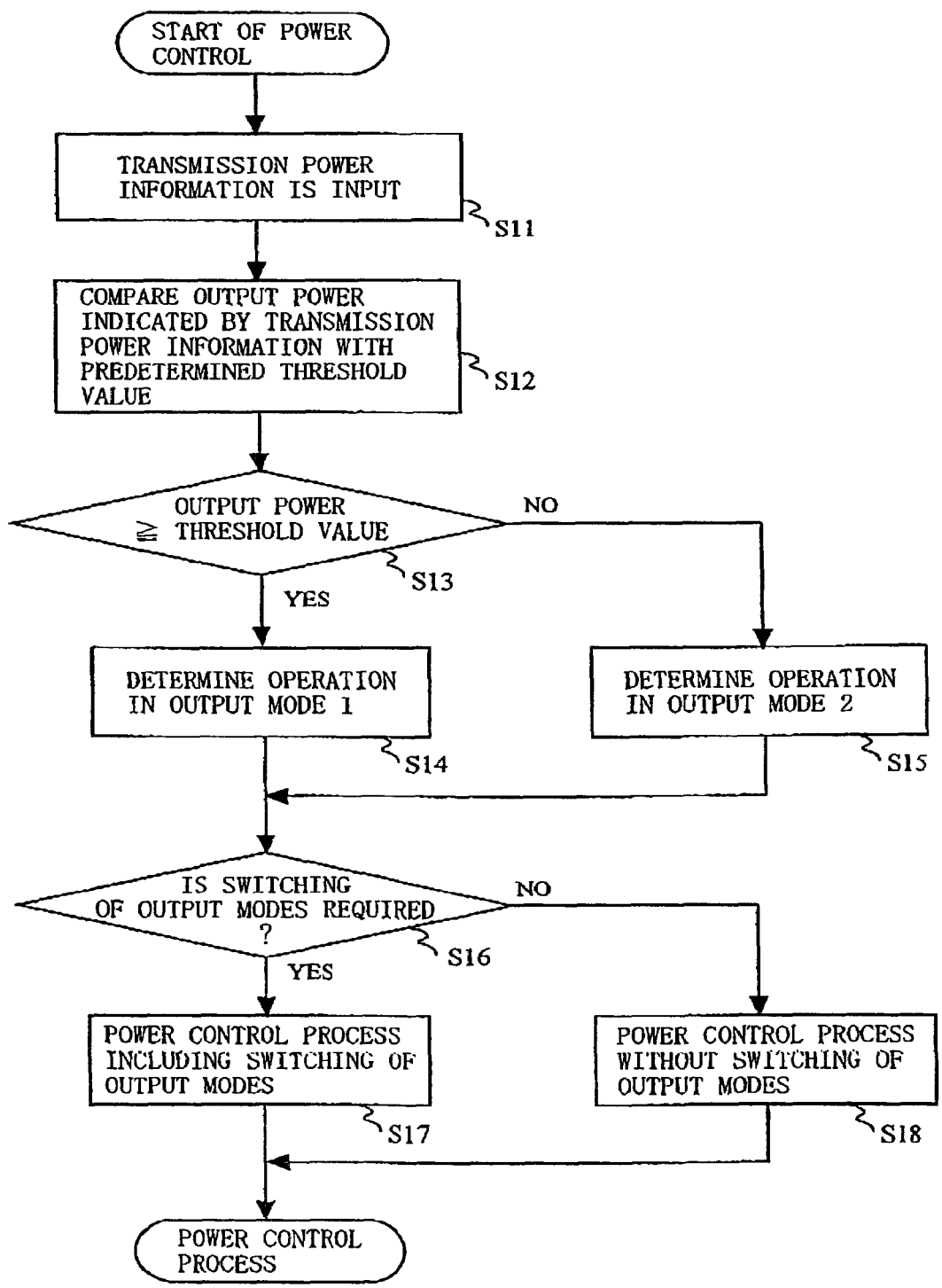
FIG. 5 is a flowchart illustrating an exemplary power control operation of the transmission circuit 1.

FIG. 5 is a flowchart illustrating an exemplary power control operation of the transmission circuit 1. Referring to FIG. 5, the transmission power information is input to the switching control section 13 (step S11). Based on the input transmission power information, the switching control section 13 determines whether the transmission circuit 1 is to be operated in the output mode 1 or the output mode 2. For example, the switching control section 13 compares a magnitude of an output power indicated by the transmission power information with a predetermined threshold value for each slot (step S12). If the magnitude of the output power indicated by the transmission power information is larger than or equal to the predetermined threshold value, the switching control section 13 determines that the transmission circuit 1 is to be operated in the output model (steps S13 and S14).

On the other hand, if the magnitude of the output power indicated by the transmission power information is smaller than the predetermined threshold value, the switching control section 13 determines that the transmission circuit 1 is to be operated in the output mode 2 (steps S13 and S15). When the output mode needs to be switched from the output mode 1 to the output mode 2, or from the output mode 2 to the output mode 1, the switching control section 13 executes a power control process including switching of the output modes (steps S16 and S17). On the other hand, when switching of the output modes is not required, the switching control section 13 executes a power control process which does not include switching of the output modes (step S18). Note that the power control process which does not include switching of the output modes (step S18) is of the conventional art and will not be described.

Figure 6:
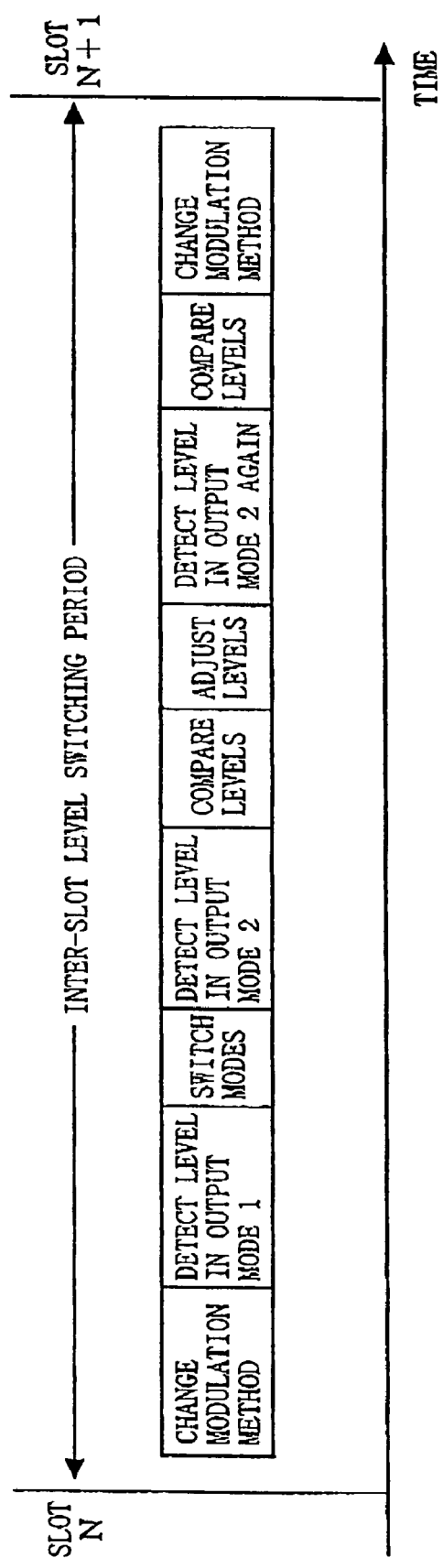
FIG. 6 is a timing chart of a power control process including switching of output modes.
Figure 7:
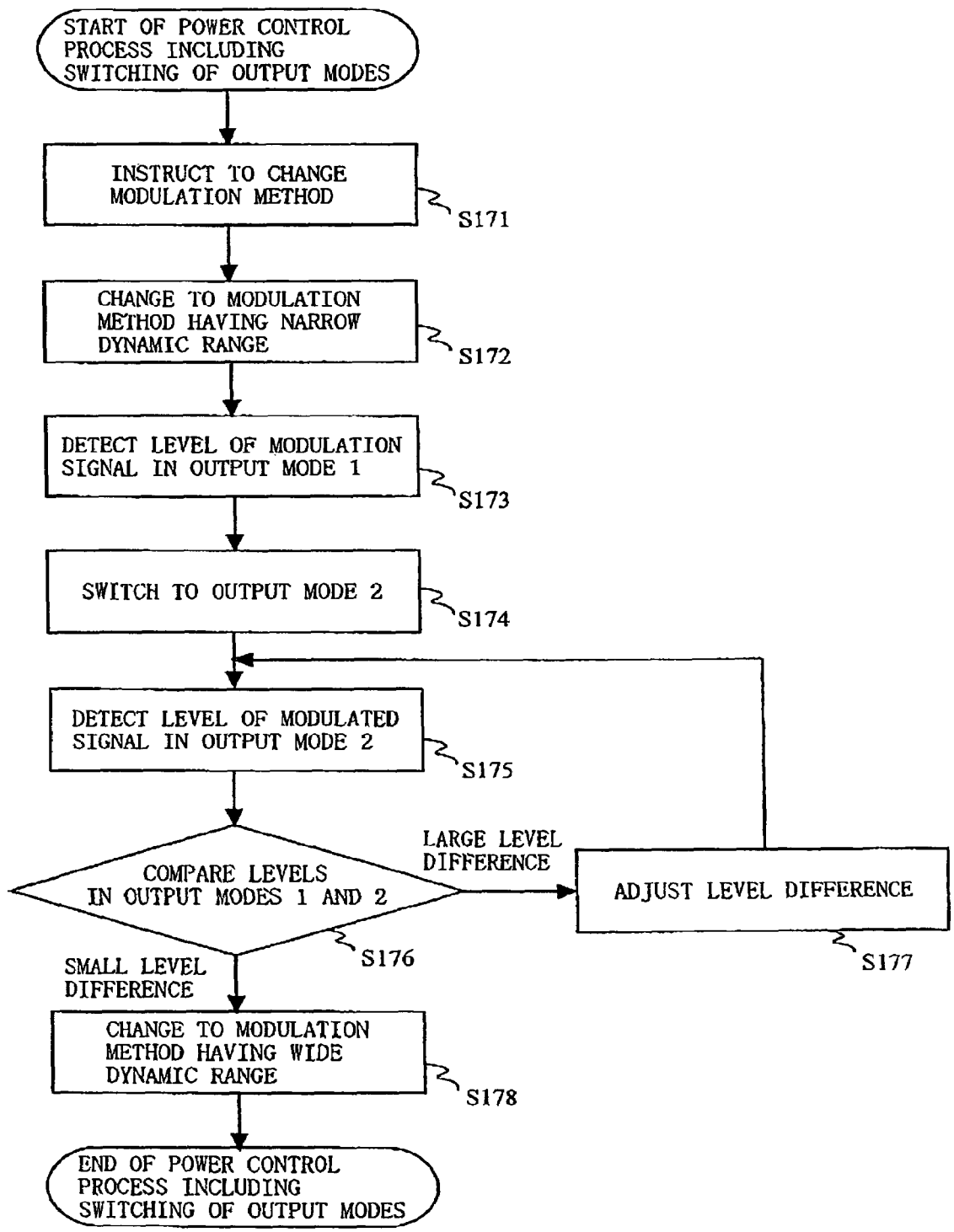
FIG. 7 is a flowchart illustrating an exemplary operation of the power control process including switching of the output modes.

FIG. 6 is a timing chart of the power control process including switching of the output modes (step 517). The transmission circuit 1 executes the power control process including switching of the output modes during the inter-slot level switching period in the sequence of FIG. 6. FIG. 7 is a flowchart illustrating an exemplary operation of the power control process including switching of the output modes. Note that FIGS. 6 and 7 illustrate the power control process when the output mode 1 is switched to the output mode 2.

Figure 8:
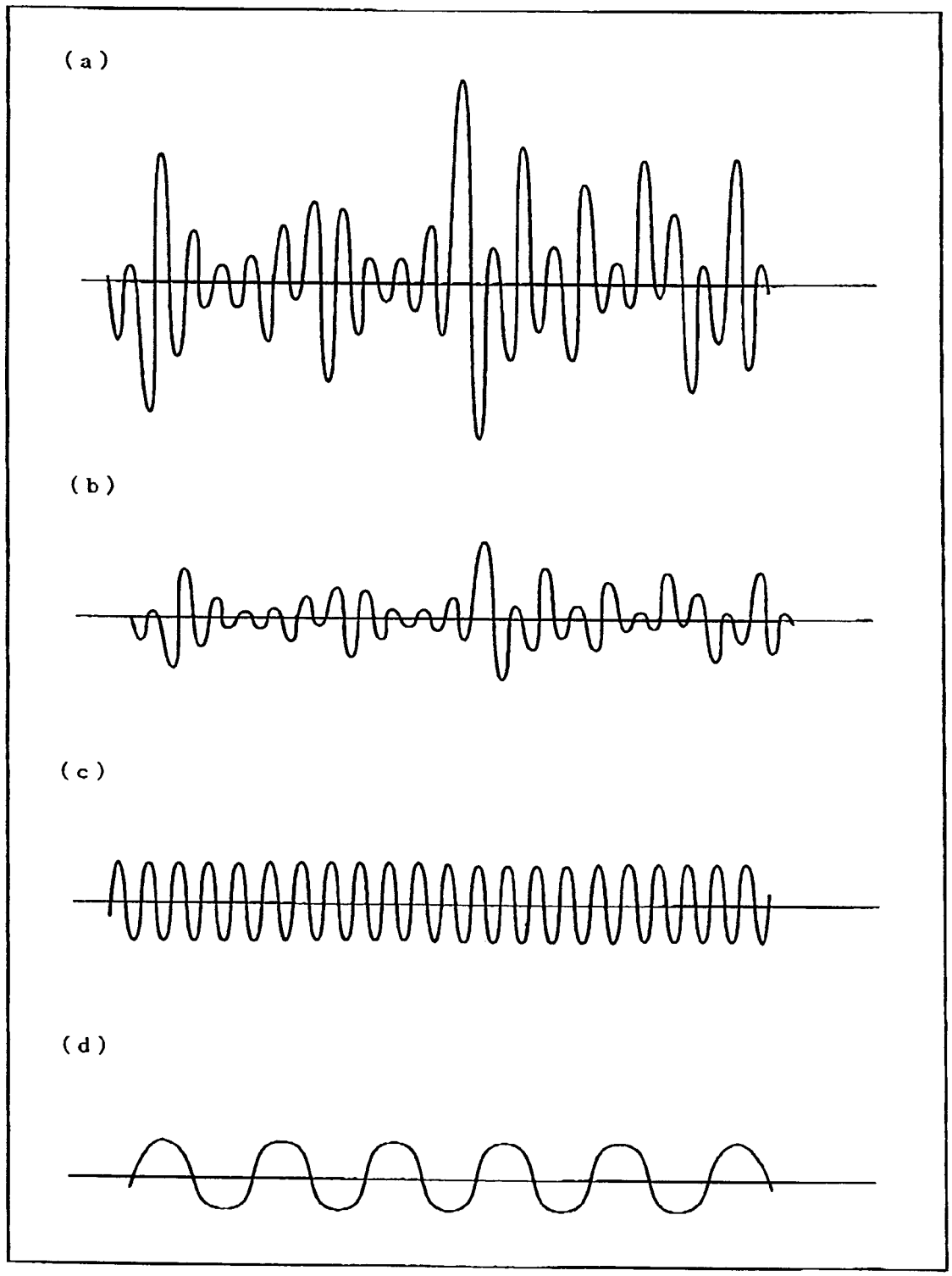
FIG. 8 is a diagram illustrating an example of a modulation method of a modulated signal generating section 12.

Referring to FIG. 7, when the output mode 1 is switched to the output mode 2, the switching control section 13 instructs the modulation method changing section 11 to change the modulation method (step S171). When instructed by the switching control section 13 to change the modulation method, the modulation method changing section 11 changes the modulation method of the modulated signal generating section 12 from a modulation method having a wide dynamic range to a modulation method having a narrow dynamic range (step S172). FIG. 8 is a diagram illustrating an example of the modulation method of the modulated signal generating section 12. As illustrated in (a) of FIG. 8, the modulated signal generating section 12 typically generates a modulated signal using the modulation method having the wide dynamic range, such as HPSK, HSDPA or the like. On the other hand, when the modulation method is changed by the modulation method changing section 11, the modulated signal generating section 12 generates a modulated signal using the modulation method having the narrow dynamic range as illustrated in (b) of FIG. 8.

Note that, when instructed by the switching control section 13 to change the modulation method, the modulation method changing section 11 may change the modulation method of the modulated signal generating section 12 to a modulation method of generating a modulated signal from which only an amplitude component is removed. In this case, for example, as illustrated in (c) of FIG. 8, the modulated signal generating section 12 generates a modulated signal from which only an amplitude component is removed (i.e., a sine wave). Alternatively, as illustrated in (d) of FIG. 8, the modulated signal generating section 12 may decrease a dynamic range and a modulation frequency of the modulated signal.

Referring to FIG. 7, the transmission circuit 1 operates in the output mode 1. The level detecting section 20 detects the level of the modulated signal in the output mode 1 (step S173). Next, the switching control section 13 switches the output of the switching section 14 to the second variable amplification section 16 so that the transmission circuit 1 is operated in the output mode 2 (step S174). The level detecting section 20 detects the level of the modulated signal in the output mode 2 (step S175). The smoothing circuit 21 smoothes the level of the modulated signal in the output mode 1 and the output mode 2, and outputs the smoothed level of the modulated signal to the output adjustment control section 22.

The output adjustment control section 22 compares the level of the modulated signal in the output mode 1 with the level of the modulated signal in the output mode 2 (step S176). When a difference in level between the two signals is larger than a predetermined difference threshold value, the output adjustment control section 22 controls the gain of the first variable amplification section 15 or the second variable amplification section 16 so as to adjust the level difference between the two signals to be smaller than the predetermined difference threshold value (step S177). For example, when the output mode 1 is switched to the output mode 2, the output adjustment control section 22 controls the gain of the second variable amplification section 16 so as to adjust the level difference between the two signals. Also, when the output mode 2 is switched to the output mode 1, the output adjustment control section 22 controls the gain of the first variable amplification section 15 so as to adjust the level difference between the two signals.

The transmission circuit 1 repeats the processes of steps S175 to S177 until the level difference between the modulated signal in the output mode 1 and the modulated signal in the output mode 2 is caused to be smaller than the predetermined difference threshold value. When the level difference between the modulated signal in the output mode 1 and the modulated signal in the output mode 2 is smaller than the predetermined difference threshold value, the switching control section 13 changes the modulation method of the modulated signal generating section 12 to the modulation method having the wide dynamic range (step S178).

As described above, according to the transmission circuit 1 of the first embodiment of the present invention, a plurality of amplification sections having different characteristics are switched and operated, depending on the magnitude of the output power of the transmission power information, thereby making it possible to transmit a transmission signal having a wide dynamic range with high efficiency. In addition, when the amplification sections are switched, the transmission circuit 1 changes the modulation method of a transmission signal to the modulation method having the narrow dynamic range, and based on the modulated signal having the narrow dynamic range, adjusts the output power in association with switching of the amplification sections, thereby making it possible to increase the speed of detection of the level of the modulated signal in the level detecting section 20 and the speed of smoothing of the level of the modulated signal in the smoothing circuit 21. Thereby, the transmission circuit 1 can quickly and accurately control the output power even when a transmission signal is output at a high modulation rate and in a wide dynamic range.

Note that the transmission circuit 1 may compare the level of a modulated signal having a wide dynamic range before switching of the output modes with the level of a modulated signal having a narrow dynamic range during the output mode switching period, and based on the result of the comparison, the control of the output adjustment control section 22 performed with respect to the first variable amplification section 15 or the second variable amplification section 16 may be corrected. Thereby, the transmission circuit 1 can reduce occurrence of an error caused by adjustment of the output power of a transmission signal modulated by a modulation method having a wide dynamic range, based on a transmission signal modulated by a modulation method having a narrow dynamic range.

Second Embodiment

Figure 9:
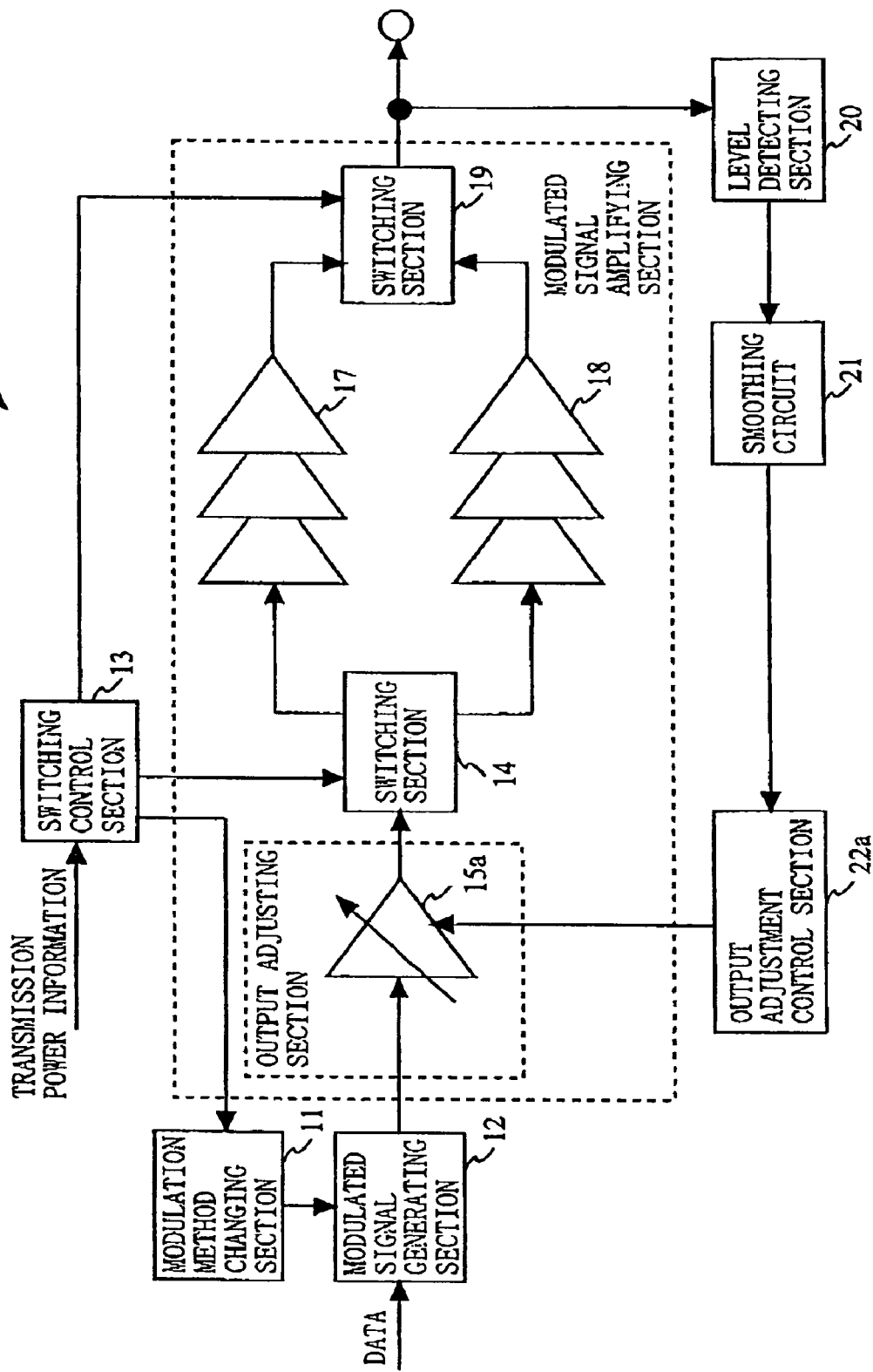
FIG. 9 is a block diagram illustrating an exemplary configuration of a transmission circuit 2 according to a second embodiment of the present invention.

FIG. 9 is a block diagram illustrating an exemplary configuration of a transmission circuit 2 according to a second embodiment of the present invention. In FIG. 9, the transmission circuit 2 of the second embodiment is different from that of the first embodiment in a modulated signal amplifying section and an output adjustment control section 22a. In the transmission circuit 2, the modulated signal amplifying section includes a variable amplification section 15a, a switching section 14, a first amplification section 17, a second amplification section 18, and a switching section 19. The output adjustment control section 22a controls a gain of the variable amplification section 15a based on the level of a modulated signal smoothed by the smoothing circuit 21.

Hereinafter, only an operation(s) of the transmission circuit 2 of the second embodiment different from that of the first embodiment will be described. When the level difference between the modulated signal in the output mode 1 and the modulated signal in the output mode 2 is larger than a predetermined difference threshold value, the output adjustment control section 22a controls the gain of the variable amplification section 15a so that the level difference between the two signals is reduced. The variable amplification section 15a amplifies the modulated signal based on the gain controlled by the output adjustment control section 22a. Thereby, the transmission circuit 2 can quickly and accurately controls the output power even when a transmission signal is output at a high modulation rate and in a wide dynamic range. In addition, the transmission circuit 2 can reduce the number of variable amplification sections as compared to the first embodiment.

Figure 10:
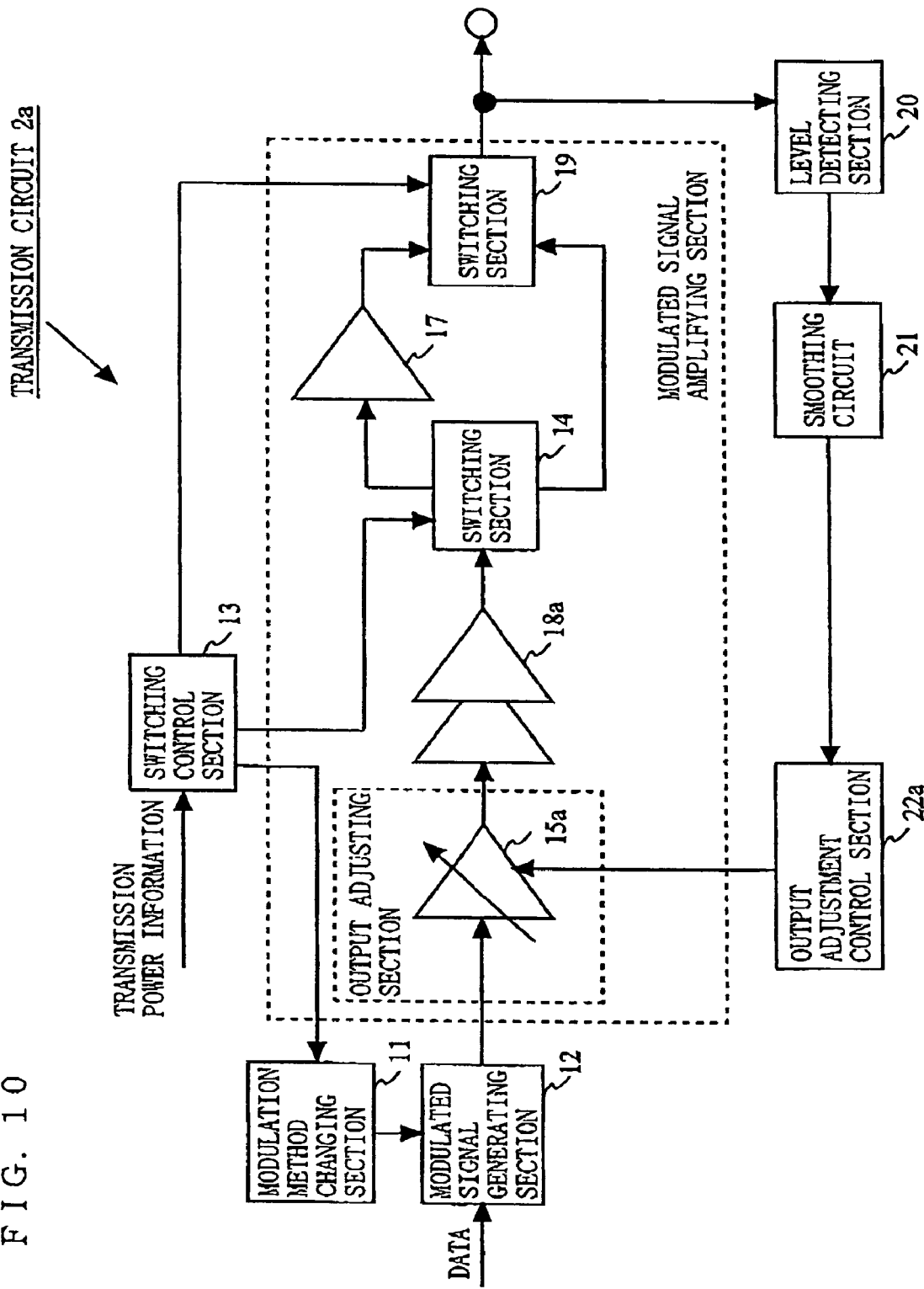
FIG. 10 is a block diagram illustrating an exemplary configuration of a transmission circuit 2a according to the second embodiment of the present invention.

A transmission circuit 2a according to the second embodiment may have a configuration illustrated in FIG. 10, for example. FIG. 10 is a block diagram illustrating an exemplary configuration of the transmission circuit 2a according to the second embodiment of the present invention. In FIG. 10, the modulated signal amplifying section includes a variable amplification section 15a, a second amplification section 18a, a switching section 14, a first amplification section 17, and a switching section 19. Thereby, the transmission circuit 2a amplifies a modulated signal by the second amplification section 18a before the modulated signal is input to the switching section 14, thereby making it possible to reduce the number of amplifiers between the switching section 14 and the switching section 19

Figure 11:
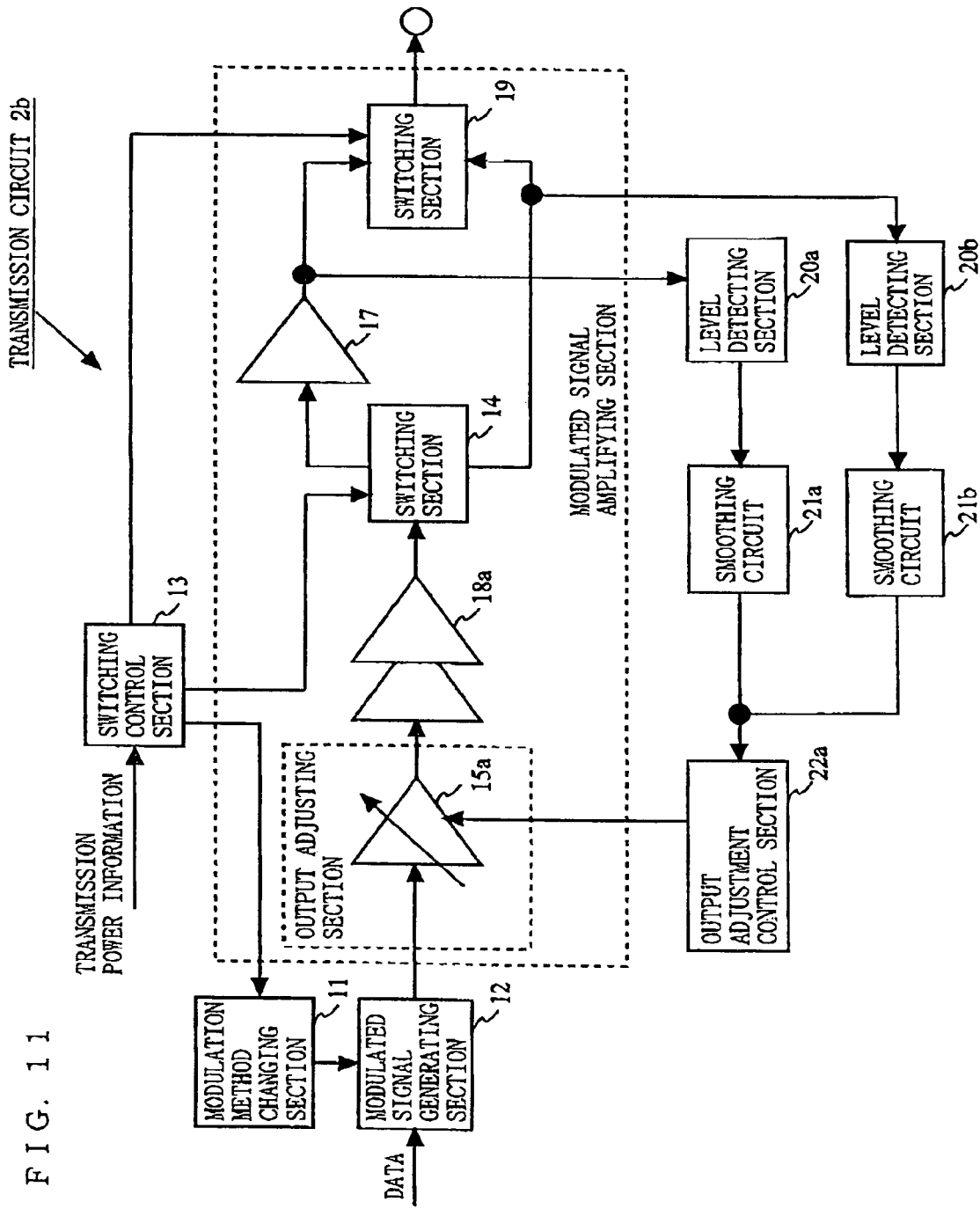
FIG. 11 is a block diagram illustrating a configuration of a transmission circuit 2b according to the second embodiment of the present invention.

A transmission circuit 2b according to the second embodiment may have a configuration illustrated in FIG. 11, for example. FIG. 11 is a block diagram illustrating a configuration of the transmission circuit 2b according to the second embodiment of the present invention. In FIG. 11, the transmission circuit 2b is different from the transmission circuit 2a (see FIG. 10) in that a plurality of level detecting sections 20a and 20b and a plurality of smoothing circuits 21a and 21b are provided. In the transmission circuit 2b, the level detecting section 20a and the smoothing circuit 21a detect the level of a modulated signal in the output model, and smooth the detected level of the modulated signal. The level detecting section 20b and the smoothing circuit 21b detect the level of a modulated signal in the output mode 2, and smooth the detected level of the modulated signal. Thereby, the transmission circuit 2b causes the level detecting section 20a and the smoothing circuit 21a to operate in the output mode 1, and the level detecting section 20b and the smoothing circuit 21b to operate in the output mode 2, thereby making it possible to reduce dynamic ranges required for the level detecting section and the smoothing circuit.

Third Embodiment

FIG. 12 is a block diagram illustrating an exemplary configuration of a transmission circuit 3 according to a third embodiment of the present invention. In FIG. 12, the transmission circuit 3 of the third embodiment is different from the transmission circuit 1 of the first embodiment in that a bias switching section 23 is further provided. In addition, the modulated signal amplifying section includes a variable amplification section 15a and an amplification section 17a. The switching control section 13a switches bias voltages which the bias switching section 23 supplies to the amplification section 17a, based on the transmission power information. Thereby, as in the transmission circuit 1 of the first embodiment, the transmission circuit 3 can quickly and accurately control the output power even when a transmission signal is output at a high modulation rate and in a wide dynamic range.

Fourth Embodiment

Figure 13:
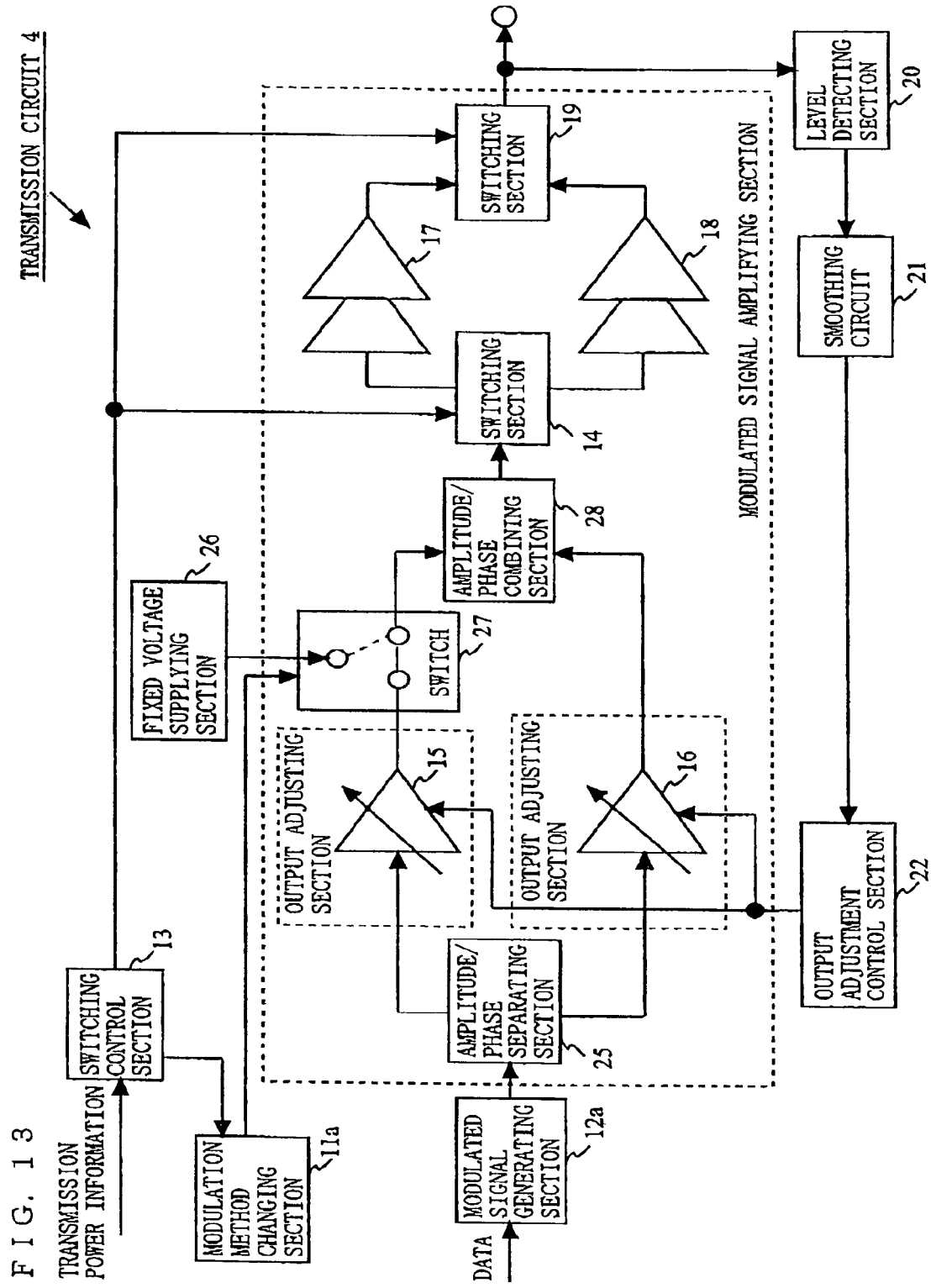
FIG. 13 is a block diagram illustrating an exemplary configuration of a transmission circuit 4 according to a fourth embodiment of the present invention.
Figure 16:
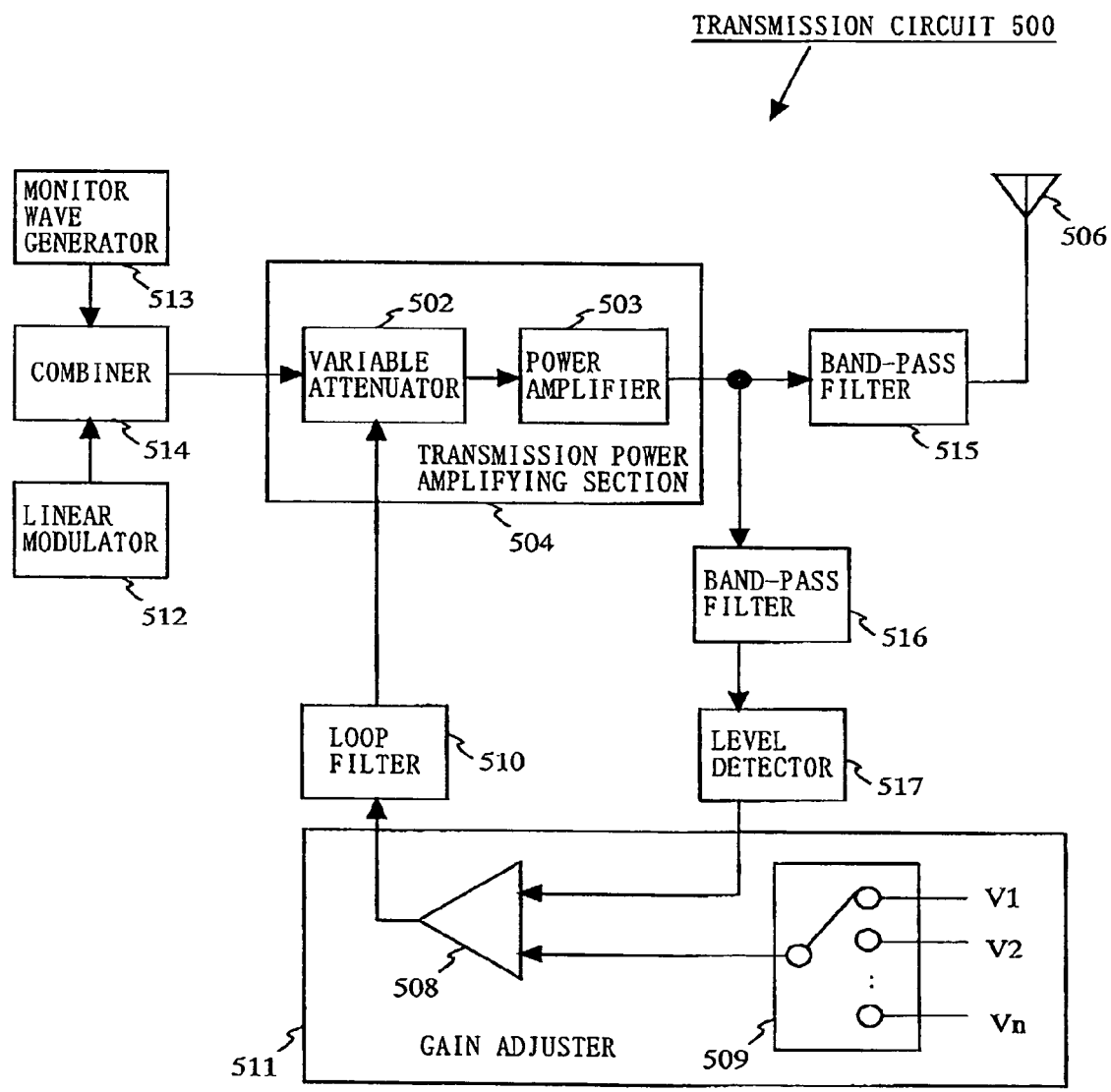
FIG. 16 is a block diagram illustrating a configuration of a conventional transmission circuit 500.
Figure 17:
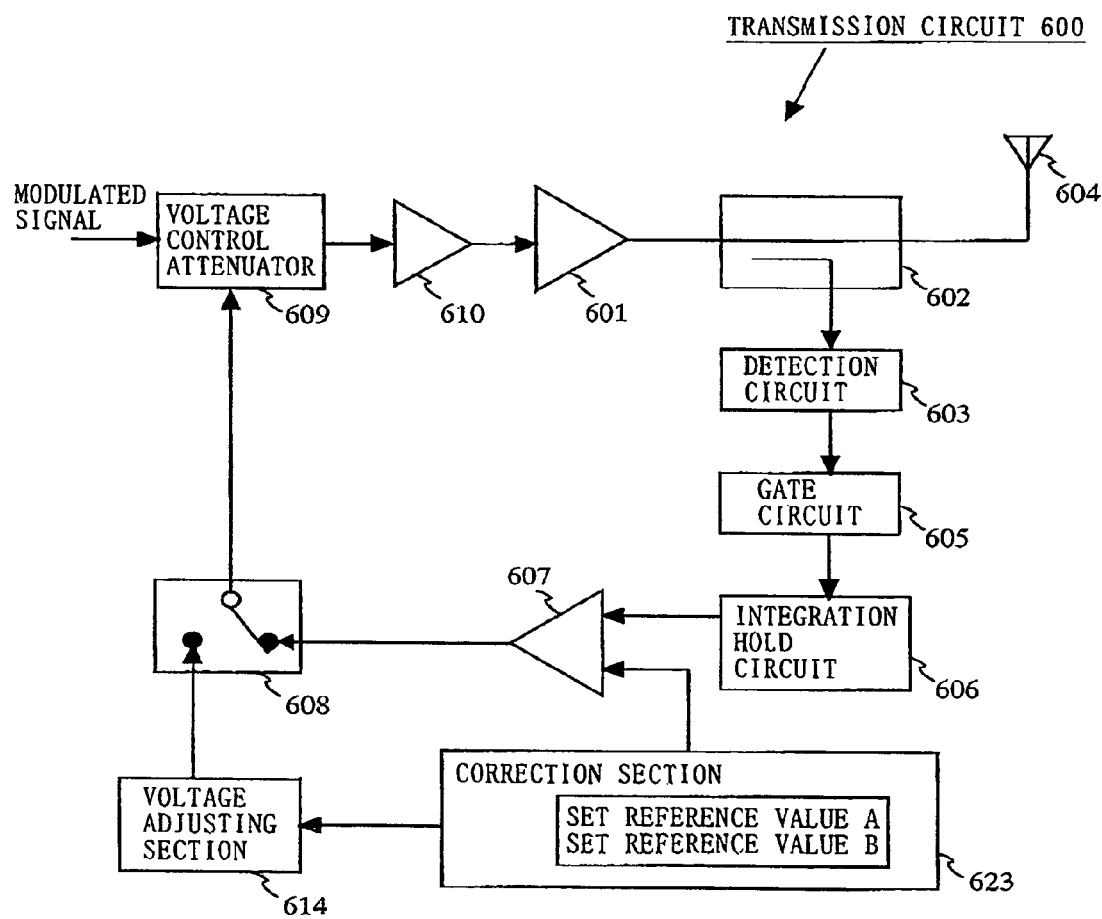
FIG. 17 is a block diagram illustrating a conventional transmission circuit 600.

FIG. 13 is a block diagram illustrating an exemplary configuration of a transmission circuit 4 according to a fourth embodiment of the present invention. In FIG. 13, the transmission circuit 4 of the fourth embodiment comprises a modulation method changing section 11a, a modulated signal generating section 12a, a switching control section 13, an amplitude/phase separating section 25, a first variable amplification section 15, a second variable amplification section 16, a first switching section 14, a first amplification section 17, a second amplification section 18, a second the switching section 19, a level detecting section 20, a smoothing circuit 21, an output adjustment control section 22, a fixed voltage supplying section 26, a switch 27, and an amplitude/phase combining section 28. In the fourth embodiment, parts similar to those of the first embodiment are indicated by the same reference numerals and will not be described.

The modulated signal generating section 12a modulates input data using a predetermined modulation method to generate a modulated signal. The modulated signal generated by the modulated signal generating section 12a is input to the amplitude/phase separating section 25. The amplitude/phase separating section 25 separates an amplitude component and a phase component from the modulated signal output from the modulated signal generating section 12a. The modulation method changing section 11a, when instructed by the switching control section 13 to change the modulation method, switches the connection of the switch 27 so that the fixed voltage supplying section 26 and the amplitude/phase combining section 28 are connected to each other. In other words, when the output modes are not switched, the amplitude component of the modulated signal is input via the first variable amplification section 15 and the switch 27 to the amplitude/ phase combining section 28. The amplitude/phase combining section 28 combines the input amplitude and phase components, and outputs the result as a modulated signal.

On the other hand, when the output modes are switched, a fixed voltage is supplied from the fixed voltage supplying section 26 via the switch 27 to the amplitude/phase combining section 28. The amplitude/phase combining section 28 receives the fixed voltage as an amplitude component having a constant level, combines the amplitude component having the constant level and the phase component, and outputs the result as a modulated signal. The modulated signal output from the amplitude/phase combining section 28 is output as a transmission signal via the first switching section 14, the second the switching section 19, and the first amplification section 17 or the second amplification section 18.

As described above, according to the transmission circuit 4 of the fourth embodiment of the present invention, during switching of the amplification sections, the output power can be adjusted in association with switching of the amplification sections, based on a modulated signal having a constant amplitude component (i.e., a modulated signal having a narrow dynamic range). Thereby, the transmission circuit 4 can increase the speed of smoothing of the level of a modulated signal in the smoothing circuit 21, and can quickly and accurately control the output power when a transmission signal is output at a high modulation rate and in a wide dynamic range.

Fifth Embodiment

FIG. 14 is a block diagram illustrated an exemplary configuration of a transmission circuit 5 according to a fifth embodiment of the present invention. In FIG. 14, the transmission circuit 5 of the fifth embodiment is different from the transmission circuits of the first to fourth embodiments in that an antenna switch 24 is further provided. When the output modes are switched, the antenna switch 24 stops outputting of a transmission signal to the antenna. Thereby, when the output modes are switched, the transmission circuit 5 can prevent a signal modulated by a modulation method different from the original modulation method from being output as a transmission signal from the antenna.

Sixth Embodiment

FIG. 15 is a block diagram illustrating an exemplary configuration of a communication apparatus according to a sixth embodiment of the present invention. Referring to FIG. 15, a communication apparatus 200 of the sixth embodiment comprises a transmission circuit 210, a reception circuit 220, an antenna duplexer 230, and an antenna 240. The transmission circuit 210 is a transmission circuit according to any of the first to fifth embodiments. The antenna duplexer 230 transfers a transmission signal output from the transmission circuit 210 to the antenna 240, and prevents leakage of the transmission signal to the reception circuit 220. The antenna duplexer 230 also transfers a reception signal input from the antenna 240 to the reception circuit 220, and prevents leakage of the reception signal to the transmission circuit 210. Therefore, the transmission signal is output from the transmission circuit 210, and is emitted into the air from the antenna 240 via the antenna duplexer 230. The reception signal is received by the antenna 240, and is received by the reception circuit 220 via the antenna duplexer 230. In the communication apparatus 200 of the fifth embodiment, by using a transmission circuit of any of the first to fifth embodiments, the output power can be quickly and accurately controlled even when a transmission signal is output at a high modulation rate and in a dynamic range. Since a branch element, such as a directional coupler or the like, is not provided at an output of the transmission circuit 210, it is possible to reduce loss occurring in circuitry from the transmission circuit 210 to the antenna 240, thereby making it possible to reduce power consumption during transmission, so that the communication apparatus can be used as a radio communication apparatus for a long time. Note that the communication apparatus 200 may be composed only of the transmission circuit 210 and the antenna 240.

The transmission circuit of the present invention can be applied to a communication apparatus or the like for mobile telephony, wireless LAN or the like.

While the invention has been described in detail, the foregoing description is in all aspects illustrative and not restrictive. It is understood that numerous other modifications and variations can be devised without departing from the scope of the invention.

What is claimed is:

1. A transmission circuit for controlling an output power of a transmission signal based on transmission power information, comprising:
   a modulated signal generating section for modulating input data using a predetermined modulation method to generate a modulated signal;
   a modulation method changing section for changing a modulation method of the modulated signal generating section;
   at least one output adjusting section for adjusting an output of the modulated signal;
   a plurality of amplification sections for amplifying the modulated signal input via the output adjusting section;
   at least one switching section for switching an amplification section to be operated of the plurality of amplification sections;
   a switching control section for controlling the switching operation of the switching section based on the transmission power information;
   an output terminal for outputting the modulated signal amplified by the amplification section as the transmission signal;
   a level detecting section for detecting a level of the transmission signal;
   a smoothing circuit for smoothing the level of the transmission signal detected by the level detecting section; and
   an output adjustment control section for controlling the output adjusting section based on the smoothed level of the transmission signal to adjust the output of the modulated signal,
   wherein the switching control section controls the modulation method changing section to change the modulation method of the modulated signal generating section to a modulation method having a dynamic range narrower than that of the predetermined modulation method, before controlling the switching section to switch the plurality of amplification sections,
   the switching control section controls the modulation method changing section to change the modulation method of the modulated signal generating section back to the predetermined modulation method after the switching of the plurality of amplification sections is completed, and
   the output adjustment control section controls the output adjusting section so that a difference in level between the transmission signal which is smoothed by the smoothing circuit and is before the amplification sections are switched, and the transmission signal which is after the amplification sections are switched, is caused to be smaller than a predetermined difference threshold value, when the modulated signal generating section operates in the modulation method having the narrow dynamic range.

2. The transmission circuit according to claim 1, wherein, when the difference in level between the transmission signal before the amplification sections are switched and the transmission signal after the amplification sections are switched is not caused to be smaller than the predetermined difference threshold value, the output adjustment control section further controls the output adjusting section so that the difference in level between the transmission signal before the amplification sections are switched and the transmission signal after the amplification sections are switched is caused to be smaller than the predetermined difference threshold value.

3. The transmission circuit according to claim 1, wherein the plurality of amplification sections includes at least a first amplification section and a second amplification section, and
   the switching control section controls the switching section so that the first amplification section is operated when an output power indicated by the transmission power information is larger than or equal to a predetermined threshold value, and the second amplification section is operated when the output power indicated by the transmission power information is smaller than the predetermined threshold value.

4. The transmission circuit according to claim 1, wherein the signal modulated by the modulation method having the narrow dynamic range is a sine wave.

5. The transmission circuit according to claim 1, further comprising:
   an antenna switch for stopping outputting of the transmission signal to an antenna when the modulated signal generating section operates in the modulation method having the narrow dynamic range.

6. The transmission circuit according to claim 1, wherein the output adjustment control section stores the level of the transmission signal when the modulated signal generating section operates in the predetermined modulation method, compares the stored level of the transmission signal with the level of the transmission signal when the modulated signal generating section operates in the modulation method having the narrow dynamic range, and based on a result of the comparison, corrects the control performed with respect to the output adjusting section.

7. The transmission circuit according to claim 1, wherein the transmission circuit comprises a plurality of output adjusting sections, and
the switching section switches an output adjusting section to be operated of the plurality of output adjusting sections in accordance with a control of the switching control section.

8. A communication apparatus comprising:
a transmission circuit for generating a transmission signal; and
an antenna for outputting the transmission signal generated by the transmission circuit,
wherein the transmission circuit is the transmission circuit according to claim 1.

9. The communication apparatus according to claim 8, further comprising:
a reception circuit for processing a reception signal received from the antenna; and
an antenna duplexer for outputting the transmission signal generated by the transmission circuit to the antenna, and the reception signal received from the antenna to the reception circuit.

10. A transmission circuit for controlling an output power of a transmission signal based on transmission power information, comprising:
a modulated signal generating section for modulating input data using a predetermined modulation method to generate a modulated signal;
a modulation method changing section for changing a modulation method of the modulated signal generating section;
an output adjusting section for adjusting an output of the modulated signal;
an amplification section for amplifying the modulated signal input via the output adjusting section;
a bias switching section for switching bias voltages to be supplied to the amplification section;
a bias switching control section for controlling the switching operation of the bias switching section based on the transmission power information;
an output terminal for outputting the modulated signal amplified by the amplification section as the transmission signal;
a level detecting section for detecting a level of the transmission signal;
a smoothing circuit for smoothing the level of the transmission signal detected by the level detecting section; and
an output adjustment control section for controlling the output adjusting section based on the smoothed level of the transmission signal to adjust the output of the modulated signal,
wherein the bias switching control section controls the modulation method changing section to change the modulation method of the modulated signal generating section to a modulation method having a dynamic range narrower than that of the predetermined modulation method, before controlling the bias switching section to switch the bias voltages to be supplied to the amplification section,
the bias switching control section controls the modulation method changing section to change the modulation method of the modulated signal generating section back to the predetermined modulation method after the switching of the bias voltages to be supplied to the amplification section is completed, and
the output adjustment control section controls the output adjusting section so that a difference in level between the transmission signal which is smoothed by the smoothing circuit and is before the bias voltages to be supplied to the amplification section are switched, and the transmission signal which is after the bias voltages to be supplied to the amplification section are switched, is caused to be smaller than a predetermined difference threshold value, when the modulated signal generating section operates in the modulation method having the narrow dynamic range.

11. A transmission circuit for controlling an output power of a transmission signal based on transmission power information, comprising:
a modulated signal generating section for modulating input data using a predetermined modulation method to generate a modulated signal;
a modulation method changing section for changing a modulation method of the modulated signal generating section;
an amplitude/phase separating section for separating an amplitude component and a phase component from the modulated signal generated by the modulated signal generating section;
at least one output adjusting section for adjusting outputs of the separated amplitude and phase components;
a switch for receiving the amplitude component via the output adjusting section;
an amplitude/phase combining section for combining the amplitude component input via the switch and the phase component input via the output adjusting section to output a modulated signal;
a plurality of amplification sections for amplifying the modulated signal input via the amplitude/phase combining section;
at least one switching section for switching an amplification section to be operated of the plurality of amplification sections;
a switching control section for controlling the switching operation of the switching section based on the transmission power information;
an output terminal for outputting the modulated signal amplified by the amplification section as the transmission signal;
a level detecting section for detecting a level of the transmission signal;
a smoothing circuit for smoothing the level of the transmission signal detected by the level detecting section; and
an output adjustment control section for controlling the output adjusting section based on the smoothed level of the transmission signal to adjust the output of the modulated signal,
wherein the switching control section controls the modulation method changing section to change the modulation method of the modulated signal generating section to a modulation method having a dynamic range narrower than that of the predetermined modulation method, before controlling the switching section to switch the plurality of amplification sections, the switching control section controls the modulation method changing section to change the modulation method of the modulated signal generating section back to the predetermined modulation method after the switching of the plurality of amplification sections is completed, the modulation method changing section switches connection of the switch to output a fixed voltage to the amplitude/phase combining section when the modulated signal generating section operates in the modulation method having the narrow dynamic range, and the output adjustment control section controls the output adjusting section so that a difference in level between the transmission signal which is smoothed by the smoothing circuit and is before the amplification sections are switched, and the transmission signal which is after the amplification sections are switched, is caused to be smaller than a predetermined difference threshold value, when the modulated signal generating section operates in the modulation method having the narrow dynamic range.

* * * * *